United States Patent
Gerka et al.

(10) Patent No.: US 7,880,544 B2
(45) Date of Patent: Feb. 1, 2011

(54) DIFFERENTIAL AMPLIFIER AND APPLICATIONS THEREOF

(75) Inventors: Szymon Gerka, Tczew (PL); Miroslaw Oksiucik, Gdansk (PL)

(73) Assignee: Synopsys, Inc., Mountain View, CA (US)

( * ) Notice: Subject to any disclaimer, the term of this patent is extended or adjusted under 35 U.S.C. 154(b) by 47 days.

(21) Appl. No.: 12/369,412

(22) Filed: Feb. 11, 2009

(65) Prior Publication Data

US 2009/0206931 A1    Aug. 20, 2009

Related U.S. Application Data

(60) Provisional application No. 61/027,658, filed on Feb. 11, 2008.

(51) Int. Cl.
*H03F 3/45* (2006.01)
(52) U.S. Cl. ..................... 330/253
(58) Field of Classification Search .......... 330/252–261
See application file for complete search history.

(56) References Cited

U.S. PATENT DOCUMENTS 6,323,729 B1 *  11/2001  Sevenhans et al. ............ 330/51
7,042,289 B2 *  5/2006  Hwang et al. ............... 330/253

\* cited by examiner

*Primary Examiner*—Robert Pascal
*Assistant Examiner*—Khiem D Nguyen
(74) *Attorney, Agent, or Firm*—Bever, Hoffman & Harms, LLP; Jeanette S. Harms (57) ABSTRACT

A differential amplifier includes a first pair of differential amplifiers and a second pair of differential amplifiers. These first and second pairs of differential amplifiers are connected between first power rails and are arranged to receive a differential input signal. Third and fourth pairs of differential amplifiers are connected between second rails and also connected to the differential input signal. A current summer sums a first output current of the first pair of differential amplifiers, a second output current of the second pair of differential amplifiers, a third output current of the third pair of differential amplifiers and a fourth output current of a fourth pair of differential amplifiers to produce an output signal.

23 Claims, 4 Drawing Sheets

DIFFERENTIAL AMPLIFIER AND APPLICATIONS THEREOF

CROSS-REFERENCE TO RELATED APPLICATION

This application claims benefit under 35 U.S.C. §119(e) to U.S. Application No. 61/027,658, filed Feb. 11, 2008, which is incorporated by reference herein in its entirety.

BACKGROUND

The invention relates to a differential amplifier having a differential input signal, and a single-ended output signal with two pairs of differential amplifiers. Modern CMOS technologies such as those used by ChipIdea Microelectronica, Lisbon, Portugal, (as well as by other companies) allow dimensions of microelectronic circuits and levels of supply voltages on supply rails to be scaled down with respect to older technologies. However, interfaces to circuits with which CMOS circuits must operate are standardized to operate at particular voltage levels not necessarily compatible with CMOS. Many of these interface standards have not been updated despite a trend in the industry to decrease the supply voltages on supply rails. Digital SOCs take advantage of a reduction in supply voltage to allow the reduction of silicon area and to increase the speed of operation of microelectronic circuits.

One requirement in designing analog circuits which are included in SOCs is that the analog circuits need to be compliant with existing standards. For example, the specification of USB 2.0 requires a supply voltage of 3.3V in LS/FS mode on a supply rail. However, the circuit might be implemented using CMOS devices which operate at the supply voltage of 1.8V or 2.5V. As a result, it is possible that the input signal at 3.3 V must be processable using the CMOS devices operating at the supply voltage of 1.8V or 2.5V.

There is also a requirement in circuit design techniques to provide an amplifier in a receiver which ensures proper operation of the receiver without any degradation or life-time reduction of the receiver and, in particular, of the CMOS devices within the receiver.

SUMMARY OF THE INVENTION

Embodiments of the invention described herein relate to a differential amplifier arranged to receive a differential input signal and provide a single-ended output signal.

According to one embodiment of the invention, there is provided a differential amplifier having upper and lower halves. The upper half operates in a first voltage range and the lower half operates in a second voltage range. The upper half amplifies input signal components within a first input signal voltage range and the lower half amplifies input signal components within a second input signal voltage range.

According to another embodiment of the invention, there is provided a differential amplifier including four pairs of differential amplifiers and a current summer. First and second pairs of differential amplifiers are connected between first rails and are configured to receive a differential input signal. Third and fourth pairs of differential amplifiers are connected between second rails and are configured to receive the differential input signal. A current summer sums a first output current of the first pair of differential amplifiers, a second output current of the second pair of differential amplifiers, a third output current of the third pair of differential amplifiers and a fourth output current of the fourth pair of differential amplifiers to produce an output signal.

According to yet another embodiment of the invention, there is provided a method for amplifying an input differential signal. An input differential signal is coupled to an input of a first pair of differential amplifiers and to an input of a second pair of differential amplifiers. The input differential signal is amplified by the first pair of pair of differential amplifiers when the input differential signal exceeds a specified voltage. The input differential signal is amplified by the second pair of pair of differential amplifiers when the input differential signal is less than the specified voltage. Outputs of the first and second pairs of differential amplifiers are summed to produce an output signal.

According to another aspect of the invention, the amplifying carried out as described above can be accomplished by programming a computing device to mimic the hardware described above or to carry out the method described above.

Further embodiments, features, and advantages of the present invention, as well as the structure and operation of various embodiments of the present invention, are described in detail below with reference to the accompanying drawings.

DETAILED DESCRIPTION

General Principles

According to one embodiment of the invention, there is provided a differential amplifier having upper and lower halves. The upper half operates in a first voltage range and the lower half operates in a second voltage range. The upper half amplifies input signal components within a first input signal voltage range and the lower half amplifies input signal components within a second input signal voltage range.

The upper half of the differential amplifier may be constituted by one or two pairs of differential amplifiers. Similarly, the lower half of the differential amplifier may be constituted by one or two pairs of differential amplifiers.

For example, a differential amplifier according to the invention may include two pairs of amplifiers in its upper half and two pairs of amplifiers in its lower half. Thus, the complete differential amplifier may include four pairs of differential amplifiers. As used throughout this patent document a "pair of differential amplifiers" is also referred to by the shorthand "differential pair."

A first differential pair and a second differential pair are connected between a first pair of rails and are configured to receive a differential input signal. Third and fourth differential pairs of amplifiers are connected between a second pair of rails and are configured to receive a differential input signal. A current summer sums a first output current of the first differential pair, a second output current of the second differential pair, a third output current of the third differential pair and a fourth output current of the fourth differential pair to produce an output signal.

The two pairs of differential amplifiers, connected between two different pairs of rails, divide the differential amplifier into two halves and allows each half to operate at different voltages. For example, the differential input signal can be "split" into two parts. One of the two parts—a higher voltage part—can be passed to a higher voltage half of the differential amplifier and be amplified by that half. A lower voltage part of the differential input signal can be passed to a lower voltage half of the differential amplifier and be amplified by that half. Output currents from the higher and lower voltage halves are then summed and passed through a load to produce a single-ended signal.

The higher voltage half of the differential amplifier includes a first pair of rails including first and second rails. The lower voltage half of the differential amplifier includes a second pair of rails including third and fourth rail. The voltage on the first rail is higher than the voltage of the second rail. The voltage on the third rail is higher than the voltage on the fourth rail. There may be overlap of the voltage ranges of the first and second pairs of rails.

A first voltage follower is connected between the first pair of rails and is arranged to receive the differential input signal and provide an output to the first pair of differential amplifiers. A high voltage limiter is connected between the first pair of rails and is arranged to receive the differential input signal and provide an output to the second pair of differential amplifiers.

Similarly, a low voltage limiter is connected between the second pair of rails and is arranged to receive the differential input signal and provide an output to the third pair of differential amplifiers. A second voltage follower is connected between the second pair of rails and is arranged to receive the differential input signal and provide an output to the fourth pair of differential amplifiers.

An embodiment of the invention provides a method for amplifying an input differential signal by amplifying different voltage ranges of input signal in different halves of a differential amplifier operating at different voltage levels and then combining outputs of the halves. An input differential signal is coupled to an input of a first pair of pair of differential amplifiers and to an input of a second pair of pair of differential amplifiers. The input differential signal is amplified by the first pair of pair of differential amplifiers when the input differential signal exceeds a specified voltage. It is amplified by the second pair of differential amplifiers when the input differential signal is less than the specified voltage. Outputs of the two pairs of differential amplifiers are combined to produce an output signal of the differential amplifier.

A CMOS Embodiment

Figure 1:
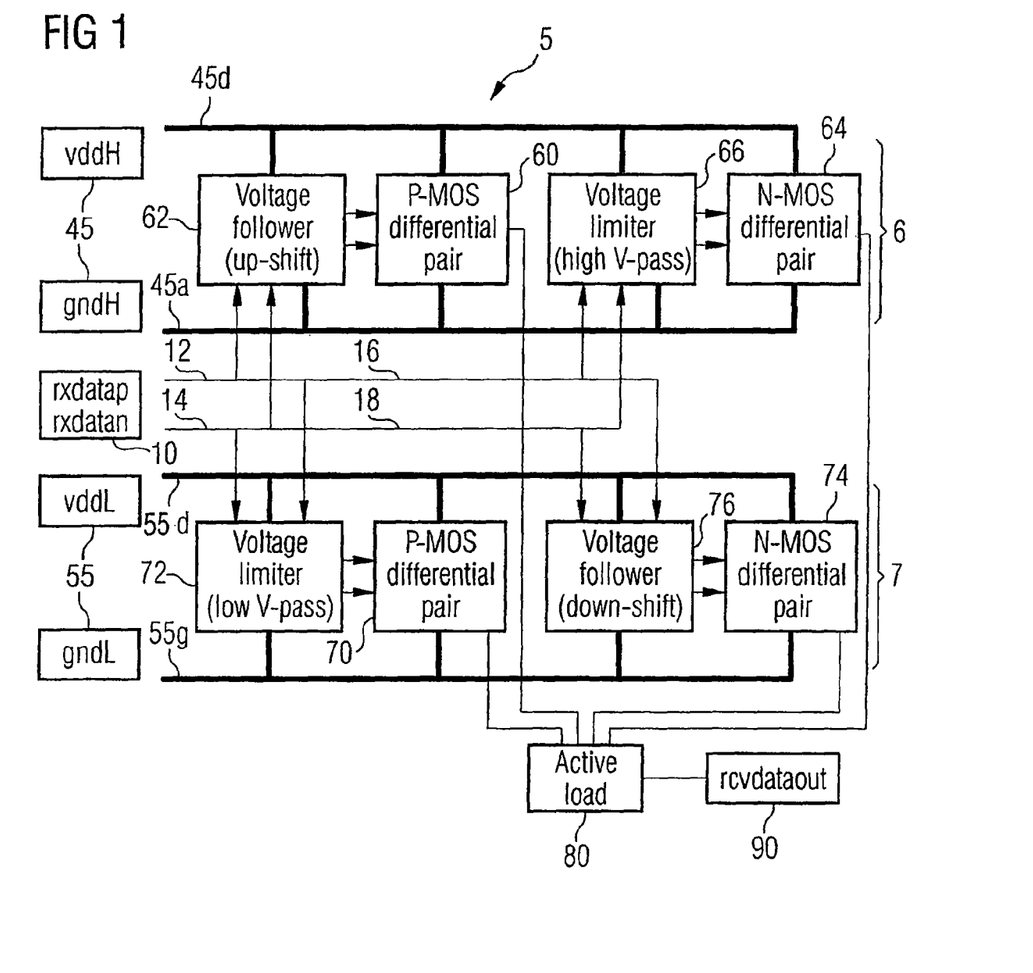
FIG. 1 is a schematic diagram showing an overview of the differential amplifier according to an embodiment of the invention.

FIG. 1 is a block/schematic diagram showing an overview of a differential amplifier 5 according to an embodiment of the invention. The differential amplifier 5 is constructed and arranged to receive a differential input (rxdatap rxdatan) 10 and provide a single ended output (rcvdataout) 90. The differential input 10 has a positive input terminal 12 for receiving the positive part rxdatap of input 10 and a negative input terminal 14 for receiving the negative part rxdatan of input 10.

Differential amplifier 5 has two pairs of rails for supplying power supply voltage. A first pair of rails 45 (including a rail 45a and a rail 45d) and a second pair of rails 55 (including a rail 55d and a rail 55g) are shown in the top half and the bottom half of FIG. 1, respectively. Rail 45d is a supply rail which, in operation, is connected to a nominal supply voltage vddH. Rail 45a is, in operation, connected to a voltage gndH which is equal to the nominal supply voltage less a predetermined set voltage. The second pair of rails 55 includes a rail 55g and a rail 55d. Rail 55g, in operation, is connected to a nominal ground voltage gndL. Rail 55d is a supply rail, which, in operation, is connected to a voltage vddL which is a predetermined set voltage above the nominal ground voltage gndL In one non-limiting embodiment of the invention, the set voltage is, for example, 1.8V or 1.9V and the nominal supply voltage (VddH) is 3.3V. The value of the set voltage is chosen to ensure that all of the transistors working in the differential amplifier 5 operate at a safe level, as will be explained. The value of the nominal supply voltage is chosen depending on the application in which the differential amplifier 5 is used. It is possible to choose other nominal supply voltages (e.g., 5V) and set voltages (e.g. 3.3 V) as needed for other applications.

The top half 6 of the differential amplifier 5 (connected between the first pair of rails 45) will be explained in further detail. The differential input signal 10 is connected to differential inputs of a P-MOS pair of differential amplifiers 60 and a N-MOS pair of differential amplifiers 64 via input lines including an input line 16 and an input line 18. The output of P-MOS pair of differential amplifiers 60 and the output of N-MOS pair of differential amplifiers 64 are connected to an input of a current summer (Active load) 80. The output of the current summer 80 is connected to the output (rcvdataout) 90.

In the embodiment shown in FIG. 1, P-MOS pair of differential amplifiers 60 is not connected directly to the input lines 16 and 18. Rather, it is connected through a voltage follower (voltage follower (up-shift)) 62 in circuit between the P-MOS pair of differential amplifiers 60 and the input lines 16 and 18. Similarly a voltage limiter 66 is connected between the differential input of N-MOS pair of differential amplifiers 64 and the input lines 16 and 18. The function of voltage follower 62 and voltage limiter 66 will be explained below.

The bottom half 7 of the differential amplifier 5 between the second set of rails 55 has a similar construction. The differential input signal 10 is connected to differential inputs of a P-MOS pair of differential amplifiers 70 and a N-MOS pair of differential amplifiers 74 via input lines 16 and 18. The output of the P-MOS pair of differential amplifiers 70 and the output of N-MOS pair of differential amplifiers 74 are connected to an input of the current summer 80.

In the embodiment shown in FIG. 1, P-MOS pair of differential amplifiers 70 is not connected directly to the input lines 16 and 18. Rather, it is connected through a voltage limiter 72 in circuit between P-MOS pair of differential amplifiers 60 and the input lines 16 and 18. Similarly a voltage follower 76 is connected between the differential input of N-MOS pair of differential amplifiers 74 and the input lines 16 and 18. The function of voltage follower 76 and voltage limiter 72 will be explained further below.

It will be understood from the above discussion that each of the top half 6 and the bottom half 7 of the differential amplifier 5 operates in a different voltage region. The top half 6 and the bottom half 7 operate at different values of voltages. However, the difference in voltage between rail 55d and rail 55g as well as the difference in voltage between rail 45a and rail 45d is within the working range of the CMOS devices used in the differential amplifier 5. As a result, the transistors in the differential amplifier 5 will not be in voltage overstress.

The differential inputs of P-MOS pair of differential amplifiers 60 and N-MOS pair of differential amplifiers 64 as well as the differential inputs of P-MOS pair of differential amplifiers 70 and N-MOS pair of differential amplifiers 74 are protected against voltage overstress by voltage follower 62 and voltage limiter 66 and the voltage limiter 72 and voltage follower 76, respectively. At least one of the four pairs of differential amplifiers 60, 64, 70 and 74 has an appropriate operation point regardless of the common mode voltage value at the input 10.

Figures 2, 2A:
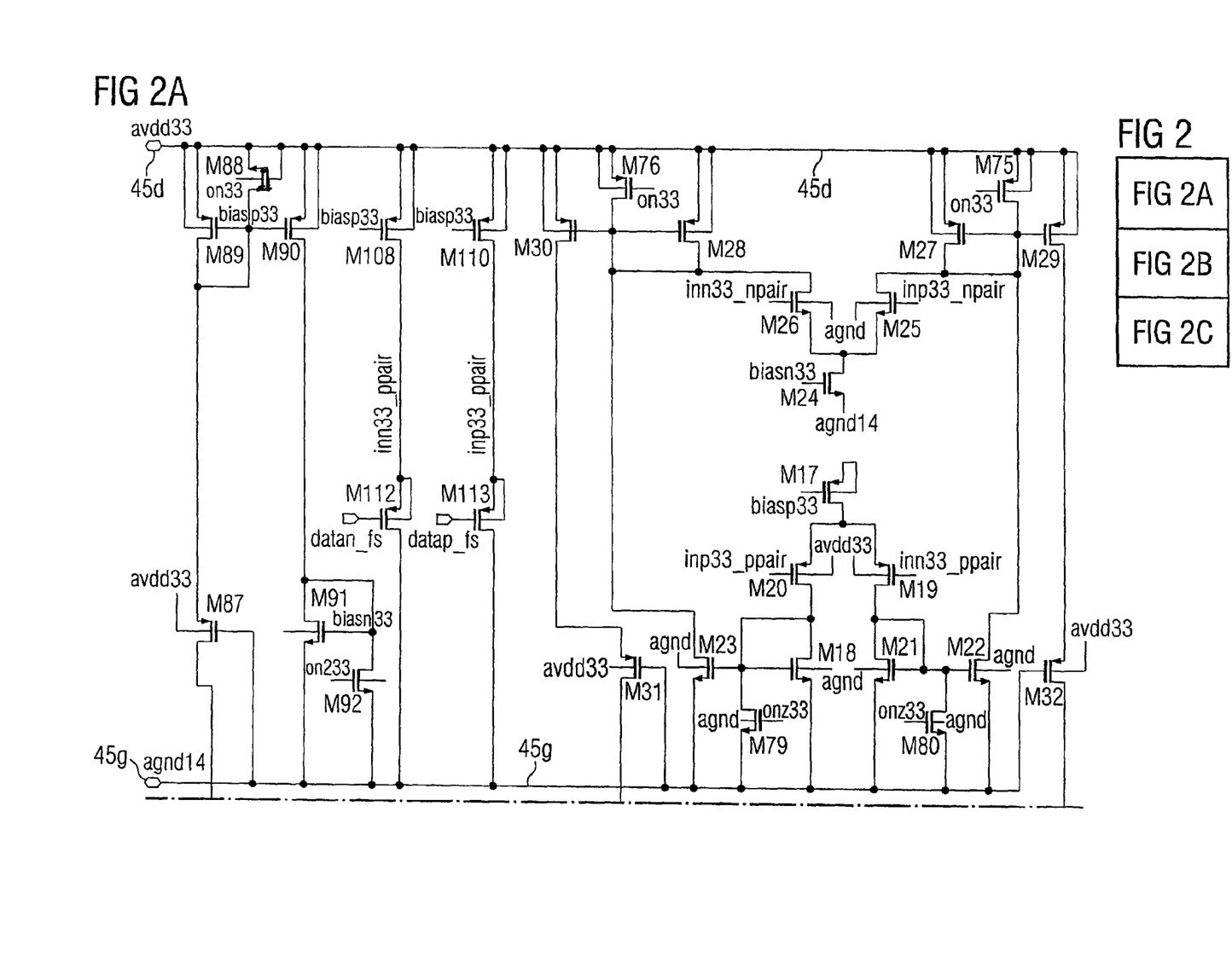
FIGS. 2A-2C are schematic diagrams showing circuit detail of an embodiment of the differential amplifier shown in FIG. 1.
Figure 2B:
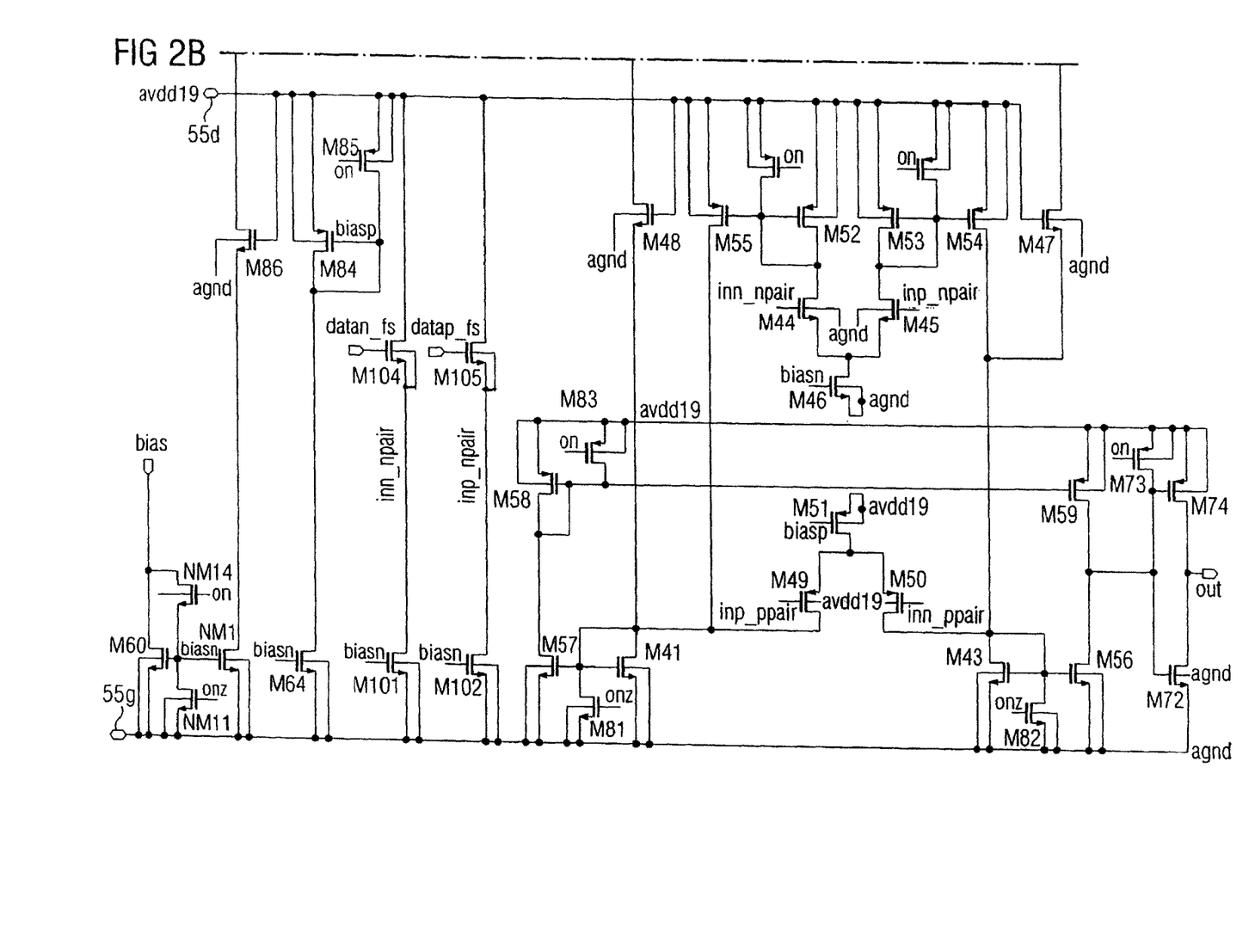
Figure 2C:
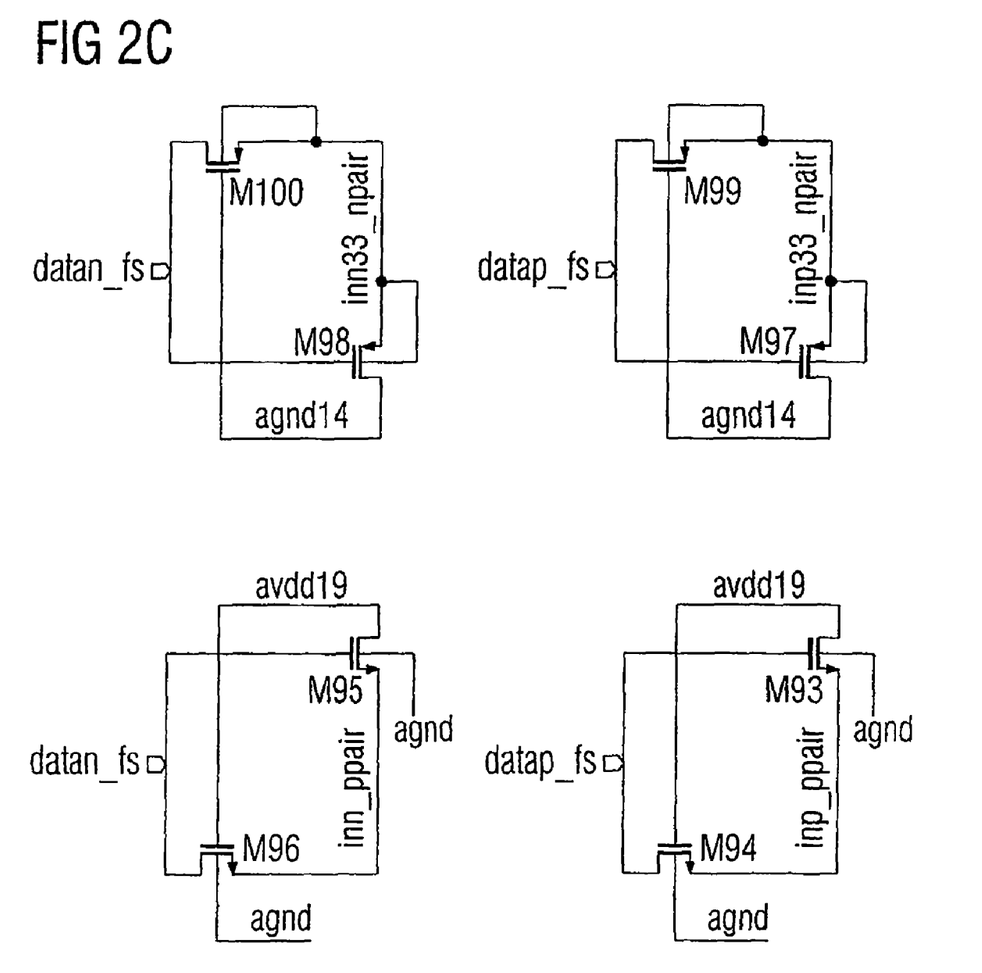

A specific circuit embodiment of differential amplifier 5 will be described with reference to FIGS. 2A, 2B and 2C. Reference numerals common to FIGS. 1, 2A, 2B and 2C denote like or equivalent elements. FIGS. 2A, 2B and 2C show different parts of the circuit shown in a more general manner in FIG. 1. The implementation shown in FIGS. 2A, 2B and 2C represent an embodiment of the invention implemented in CMOS. However, other implementations are possible.

FIG. 2A is a schematic diagram of a circuit embodiment of the top half 6 of FIG. 1. FIG. 2B is a schematic diagram of a circuit embodiment of the bottom half 7 of FIG. 1. There are three connections between the circuit of the top half 6 and the bottom half 7. These connections are: 1) between a transistor M86 and a transistor M87, 2) between a transistor M31 and a transistor M48, and 3) between a transistor M32 and a transistor M47. FIG. 2C is a schematic diagram of a circuit embodiment of the voltage limiters of the differential amplifier 5.

In FIG. 2A, data signal datan_fs corresponds to rxdatan on FIG. 1. Data signal datap_fs corresponds to rxdatap on FIG. 1. These data signals are input at gates of transistors M112 and M113 respectively. The transistors M112 and M113 are configured as source followers and correspond to voltage follower 62 of FIG. 1. A transistor M108 is connected between the source of the transistor M112 and the rail 45d. In operation, a supply voltage avdd33 is present on rail 45d. The drain of transistor M112 is connected to rail 45g. A supply voltage agnd14 is present on rail 45g. A transistor M110 is connected between the source of transistor M113 and rail 45d. The drain of the transistor M113 is connected to rail 45g. The transistors M108 and M110, both P-MOS transistors, form current sources and are mirrored from a diode connected transistor M89 as noted below. An output signal inp33_ppair is produced at the source of transistor M112 and an output signal inp33_pair is produced at the source of transistor M113. The signal inn33_ppair is passed to the gate of a transistor M20. A bias signal biasp33 is applied to the gates of the transistors M108 and M110.

The bias signal biasp33 is produced at the diode connected transistor M89 by current coming from a current mirror formed by N-MOS transistors M60 and NM1 (shown on FIG. 2B) that flows through protection transistors M86 and M87. The function of protection transistors M86 and M87 will be explained. As explained above the diode connected transistor M89 is the source of the gate potential (biasp33) of the transistors M108 and M110.

The data signals datan_fs and datap_fs are also applied to the voltage limiters shown in FIG. 2C. As can be seen from an upper half of the FIG. 2C, the data signal datan_fs is also connected to the gate of a transistor M98 and to the source of a transistor M100. The gate of the transistor M100 and the source of the transistor M98 are connected to the supply voltage agnd14. A signal inn33_npair is produced between the drain of the transistor M98 and the drain of the transistor M100. The signal inn33_npair is tapped from this circuit and passed to the gate of a transistor M26. When the value of the data signal datan_fs is greater than the supply voltage agnd14, it will be understood that the transistor M100 is open and the transistor M98 is closed. As a result the signal inn33_npair will take the value of the data signal datan_fs. If, on the other hand, the value of the data signal datan_fs is less than the supply voltage agnd14, then the transistor M100 is closed and the transistor M98 open. As a result the signal inn33_npair takes the value of the supply voltage agnd14. Thus the signal inn33*n*pair has a value which is limited to the level of the supply voltage agnd14.

The data signal datap_fs is also connected to the gate of a transistor M97 and to the source of a transistor M99. The gate of the transistor M99 and the source of the transistor M97 are connected to the supply voltage agnd14. A signal inp33_npair is produced between the drain of the transistor M97 and the drain of the transistor M99. The signal inp33_npair is tapped from this circuit and passed to the gate of a transistor M25. The transistor M99 and the transistor M97 work in the same manner as the transistor M100 and the transistor M98 which means that the value of the data signal inp33_npair is limited to the level of the supply voltage agnd14. Thus the transistors M98, M100, M97 and M99 together constitute voltage limiter 66 shown in FIG. 1.

The transistors M26 and M25 are N-MOS transistors which together constitute pair of differential amplifiers 64 shown in FIG. 1. The transistors M19 and M20 are P-MOS transistors which together constitute P-MOS pair of differential amplifiers 60 shown in FIG. 1. A transistor M28 sums the current from the drain of the transistor M26 directly and from the transistor M20 indirectly through a current mirror formed by transistors M23 and M18. The currents of the drain of the transistor M26 and the drain of the transistor M23 are summed at a transistor M28 and mirrored through a transistor M30. The gate of the transistor M30 is connected to the gate of the transistor M28. The source of the transistor M28 and the source of the transistor M30 are connected to rail 45d at the supply voltage avdd33. The drain of the transistor M28 is connected to both the drain of the transistor M26 and the drain of the transistor M23. The drain of the transistor M30 is connected to the drain of a protection transistor M48 shown in FIG. 2B through the channel of a protection transistor M31.

Similarly the currents in the drain of transistors M19 (which is mirrored through the transistor M22 and M21) and the drain of the transistor M25 are summed at a transistor M27 and mirrored through a transistor M29. The gate of the transistor M27 and the gate of the transistor M29 are connected to each other. The source of the transistor M27 and the source of the transistor M29 are connected to rail 45d at the supply voltage given by avdd33. The drain of the transistor M29 is connected to the drain of a protection transistor M47 shown in FIG. 2B through the channel of a protection transistor M32.

The protection transistor M31 and the protection transistor M32 protect the circuit in the upper half 6, which is at a higher voltage than the lower half. The protection transistor M47 and the protection transistor M48 protect the circuit in the lower half 7 which is at a lower voltage (as explained above) from the higher voltages of the upper half 6.

Turning now to FIG. 2B, it will be seen that this lower half 7 of the differential amplifier 5 has many similar features to those of upper half 6 of the differential amplifier 5 shown in FIG. 1. Rail 55g has supply voltage at ground. Rail 55d has a supply voltage given by avdd19. The data signals datan_fs and datap_fs are input at the gates of a transistor M104 and a transistor M105, respectively. The transistor M104 is connected to rail 55g (through a transistor M101) and to rail 55d. The transistor M105 is connected to rail 55g (through a transistor M102) and to rail 55d. The transistors M104 and M105 are configured as source followers and have an output signal inn_npair and an output signal inp_npair at the respective sources of the transistors M104 and M105 respectively. The transistors M104 and M105 correspond to voltage follower 76 shown in FIG. 1.

The output signal inp_npair is passed to the gate of a transistor M49 and the output signal inn_npair is passed to the gate of a transistor M44. FIG. 2C also shows the second voltage limiter 72 which includes a N-MOS transistor M96 and a N-MOS transistor M95 as well as a N-MOS transistor M94 and a N-MOS transistor M93. The gate of transistor M96 and the drain of transistor M95 are connected to the supply voltage avdd19. The gate of the transistor M95 and the drain of the transistor M96 are connected to the input signal datan_fs. A signal inn_ppair is tapped between the source of the transistor M96 and the source of the transistor M95. The signal inp_ppair is coupled to the gate of the transistor M45.

The gate of the transistor M93 and the drain of the transistor M94 are connected to the input signal datap_fs. The gate of the transistor M94 and the drain of the transistor M93 are connected to the supply voltage avdd19. A signal inp_ppair is tapped between the source of the transistor M93 and the source of the transistor M94 and coupled to the gate of the transistor M49.

The operation of the second voltage limiter 72 is similar to that of voltage limiter 66. Voltage limiter 66 passes signals which are higher than the voltage agnd14. The lower value of the signal is limited to the value agnd14. Voltage limiter 72 passes signals with values lower than avdd19. The value of the signals is limited to avdd19.

The transistors M49 and M50 are P-MOS transistors which form the pair of differential amplifiers 70 shown in FIG. 1. The transistors M44 and M45 are N-MOS transistors which form the pair of differential amplifiers 74 shown in FIG. 1. The output of the drain of the transistor M50 is summed with the output of the drain of a transistor M54 (which mirrors the current flowing through the transistor M45) and the current flowing through the channel of the transistor M47 (which is the sum of the currents from the transistors M25 and M19 in the top half 6). Similarly the output of the drain of the transistor M49 is summed with the output of the drain of a transistor M55 (which mirrors the current flowing through the transistor M44) and the current flowing through the channel of the transistor M48 (which is the sum of the current from the transistors M20 and M26 in the top half 6). Thus, the currents at the transistor M41 and M43 are the sum of all of the currents from the pair of differential amplifiers noted by the reference numerals 60, 64, 70 and 74 in FIG. 1.

The current at the transistor M41 is mirrored through a transistor M57 and again through a transistor M58 and a transistor M59. The current at the transistor M43 is mirrored through a transistor M56. The transistor M59 and the transistor M56 form a current comparator which produces the output signal rcvdataout (shown as "out" on FIG. 2B) at the output node 90 through an inverter formed from a transistor pair M74 and M72.

The transistor M60 and the transistor NM1 shown in FIG. 2B form a current mirror as disclosed above and provide a biasing circuit. The drain of the transistor M60 is connected to a current biasing signal bias. The current biasing signal bias can be taken from any suitable external current source. For example, a band gap voltage and an external resistor can be used to produce an accurate current in a feedback loop (not shown). The accurate current is mirrored into all internal cells of a chip in which the receiver is based. One of the cells is the receiver. The biasing input 90 is also connected to the gate of the transistor NM1 and to the gate of the transistor M60 through a transistor NM14. The gate of the transistor NM14 is connected to a signal which will be described later. The gate of the transistor NM1, the gate of the transistor M60 and the source of the transistor NM14 are all commonly connected to rail 55g at ground through a transistor NM11. The gate of the transistor NM11 is connected to a signal onz which will be described later. A bias voltage biasn is generated at the node connecting the gate of the transistor NM1, the gate of the transistor M60, the source of the transistor NM14 and the drain of the transistor NM1. The gate of the transistor NM14 is coupled to a signal on and the gate of the transistor NM11 is coupled to a signal onz. The signals on and onz are used in power-down mode.

The bias voltage biasn is coupled to the gates of the transistors M64, M101, M102 and to the transistor M46. The bias voltage biasn is auto-adjusted by a diode-connected transistor M60. The current bias signal sets the biasn voltage that is applied to the gates of the transistors M64, M101, M102 and M46. This causes the same current (scaled by a constant factor) to flow through these transistors, thereby creating current sources.

A bias voltage biasp is generated at the connection between the transistor M64 and a transistor M84 and a transistor M85. The bias voltage biasn is coupled to the gate of the transistor M64. The bias voltage biasp is coupled to the gate of the transistor M51 to create a current source.

The transistor NM1 is used to provide a bias to the upper half 6 of the circuit through the channel of a transistor M86 and the channel of a transistor M87 by transferring a reference current from the lower half 7 to the upper half 6. The gate of the transistor M86 is connected to rail 55d and the gate of the transistor M87 is connected to the second supply line 45g. A transistor M89 provides a biasing voltage biasp33 for the P-MOS devices in the upper half 6 of the circuit. The biasing voltage biasp33 is passed to the gates of the transistors M108, M110, M17.

A transistor M90 has a gate coupled to the gate of the transistor M89 and to the drain of M89 and mirrors the current passing to a transistor M91. The transistor M91 provides biasing voltage biasn33 at its gate. The biasing voltage biasn33 is passed to the N-MOS transistors in the upper half 6 of the circuit. The biasing voltage biasn33 is passed to the gate of the transistor M24.

The signals on and onz are complementary binary signals that control whether the receiver is in a power-down state or in a power-up state. If the value of on=1 and onz=0, the receiver is in a power-up state. Similarly if the value on of =0 and the value of onz=1 then the receiver is in a power-down sate. It should be noted in this context that the digital state "0" means that the analog voltage has a value given by agnd. Similarly the digital state "1" means that the value of the analog voltage is at a value given by avdd19.

Similarly the signals on33 and onz33 have the same function in the upper half 6 of the receiver. However, the digital state "0" means that the value of the analog voltage is given by agnd14 whereas the digital state "1" means that the value of the analog voltage is given by avdd33.

While various embodiments of the present invention have been described above, it should be understood that embodiments are examples of the invention which is broader than the examples presented. Thus, the specific embodiments do not represent limitations on the invention. Rather, they are presented to help in understanding the full scope and breadth of the invention. It will be apparent to persons skilled in the relevant computer arts that various changes in form and detail can be made therein without departing from the scope of the invention. For example, in addition to using hardware (e.g., within or coupled to a Central Processing Unit ("CPU"), microprocessor, microcontroller, digital signal processor, processor core, System on Chip ("SOC"), or any other device, implementations may also be embodied in software (e.g., computer readable code, program code, and/or instructions disposed in any form, such as source, object or machine language) disposed, for example, in a computer usable (e.g., readable) medium configured to store the software. Such software can enable, for example, the function, fabrication, modeling, simulation, description and/or testing of the apparatus and methods described herein. For example, this can be accomplished through the use of general programming languages (e.g., C, C++), hardware description languages (HDL) including Verilog HDL, VHDL, and so on, or other available programs. Such software can be disposed in any known computer usable medium such as semiconductor, magnetic disk, or optical disc (e.g., CD-ROM, DVD-ROM, etc.). The software can be stored in a computer usable (e.g., readable) transmission medium (e.g., carrier wave or any other medium including digital, optical, or analog-based medium). Embodiments of the present invention may include methods of providing the apparatus described herein by providing software describing the apparatus and subsequently transmitting the software over a communication network including the Internet and intranets.

It is understood that the apparatus and method described herein may be included in a semiconductor intellectual property core, such as a microprocessor core (e.g., embodied in HDL) and transformed to hardware in the production of integrated circuits. Additionally, the apparatus and methods described herein may be embodied as a combination of hardware and software. Thus, the present invention should not be limited by any of the above-described embodiments, but should be defined only in accordance with the following claims and their equivalents.

What is claimed is:

1. A differential amplifier, comprising:
   an amplifier upper half constructed and arranged to operate in a first voltage range;
   an amplifier lower half constructed and arranged to operate in a second voltage range;
   means for inputting a differential input signal to the upper half and to the lower half; and
   a summer for summing outputs of the upper and lower halves,
   wherein the upper half is configured to amplify input signal components within a first input signal voltage range and the lower half is configured to amplify input signal components within a second input signal voltage range, and
   wherein at least one of the amplifier upper half and the amplifier lower half includes a voltage limiter coupled to a pair of differential amplifiers.

2. A differential amplifier according to claim 1 wherein the upper half comprises:
   a P-MOS pair of differential amplifiers; and
   an N-MOS pair of differential amplifiers.

3. A differential amplifier according to claim 2 further comprising a voltage follower coupling input signal components to the P-MOS pair of differential amplifiers.

4. A differential amplifier according to claim 2, wherein the voltage limiter couples input signal components to the N-MOS pair of differential amplifiers.

5. A differential amplifier according to claim 1 wherein the lower half comprises:
   a P-MOS pair of differential amplifiers; and
   an N-MOS pair of differential amplifiers.

6. A differential amplifier according to claim 5 further comprising a voltage follower coupling input signal components to the P-MOS pair of differential amplifiers.

7. A differential amplifier according to claim 5, wherein the voltage limiter couples input signal components to the N-MOS pair of differential amplifiers.

8. A differential amplifier, comprising:
   a first pair of differential amplifiers and a second pair of differential amplifiers, the first pair of differential amplifiers and the second pair of differential amplifiers being connected between first rails and configured to receive a differential input signal;
   a third pair of differential amplifiers and a fourth pair of differential amplifiers, the third pair of differential amplifiers and the fourth pair of differential amplifiers being connected between second rails and configured to receive the differential input signal;
   a current summer for summing a first output current of the first pair of differential amplifiers, a second output current of the second pair of differential amplifiers, a third output current of the third pair of differential amplifiers and a fourth output current of the fourth pair of differential amplifiers to produce an output signal; and
   a voltage limiter connected between one of the first and second rails and configured to receive the differential input signal.

9. The differential amplifier of claim 8, wherein
   the first rails comprises a first rail and a second rail;
   the second rails comprises a third rail and a fourth rail; and
   the differential amplifier is configured to operate with a voltage on first rail that is higher than the voltage on the second rail and a voltage on the third rail that is higher than a voltage on the fourth rail.

10. The differential amplifier of claim 8, further comprising a voltage follower connected between the first rails and configured to receive the differential input signal and provide an output to the first pair of differential amplifiers.

11. The differential amplifier of claim 8, wherein the voltage limiter is a high voltage limiter connected between the first rails and configured to provide an output to the second pair of differential amplifiers.

12. The differential amplifier of claim 8, wherein the voltage limiter is a low voltage limiter connected between the second rails and configured to provide an output to the third pair of differential amplifiers.

13. The differential amplifier of claim 8 further comprising a voltage follower connected between the second rails and configured to receive the differential input signal and provide an output to the fourth pair of differential amplifiers.

14. The differential amplifier of claim 8, wherein the first pair of differential amplifiers comprises P-MOS transistors.

15. The differential amplifier of claim 8, wherein the second pair of differential amplifiers comprises N-MOS transistors.

16. The differential amplifier of claim 8, wherein the third pair of differential amplifiers comprises P-MOS transistors.

17. The differential amplifier of claim 8, wherein the fourth pair of differential amplifiers comprises N-MOS transistors.

18. A method for amplifying an input differential signal comprising:
   passing the input differential signal to an input of a first pair of pair of differential amplifiers and to an input of a second pair of pair of differential amplifiers;
   amplifying the input differential signal in the first pair of pair of differential amplifiers when the input differential signal exceeds a specified voltage;
   amplifying the input differential signal in the second pair of pair of differential amplifiers when the input differential signal is less than the specified voltage;
   protecting the first pair of pair of differential amplifiers and the second pair of pair of differential amplifiers against voltage overstress; and
   summing an output of the first pair of pair of differential amplifiers and the output of the second pair of pair of differential amplifiers to produce an output signal.

19. The method of claim 18, wherein the summing comprises summing currents produced in the first pair of pair of differential amplifiers and currents produced in the second pair of pair of differential amplifiers.

20. An article of manufacture including a non-transient computer-readable storage device having instructions stored therein and comprising executable instructions that when executed by a computing device cause it to become configured to amplify an input differential signal by:
- passing the input differential signal to an input of a first pair of pair of differential amplifiers and to an input of a second paid of pair of differential amplifiers;
- amplifying the input differential signal in the first pair of pair of differential amplifiers when the input differential signal exceeds a specified voltage;
- amplifying the input differential signal in the second pair of pair of differential amplifiers when the input differential signal is less than the specified voltage;
- protecting the first pair of pair of differential amplifiers and the second pair of pair of differential amplifiers against voltage overstress; and
- summing an output of the first pair of pair of differential amplifiers and the output of the second pair of pair of differential amplifiers to produce an output signal.

21. The article of manufacture of claim 20, wherein the instructions are programmed in a hardware description language selected from the group consisting of HDL, VHDL and RTL.

22. An article of manufacture including a non-transient computer-readable storage device having instructions stored therein and comprising executable instructions that if executed by a computing device cause it to become configured as a differential amplifier comprising:
- a first pair of differential amplifiers and a second pair of differential amplifiers, the first pair of differential amplifiers and the second pair of differential amplifiers being connected between first rails and configured to receive a differential input signal;
- a third pair of differential amplifiers and a fourth pair of differential amplifiers, the third pair of differential amplifiers and the fourth pair of differential amplifiers being connected between second rails and configured to receive the differential input signal;
- a first voltage limiter coupled to the second pair of differential amplifiers and a second voltage limiter coupled to the third pair of differential amplifiers; and
- a current summer for summing a first output current of the first pair of differential amplifiers, a second output current of the second pair of differential amplifiers, a third output current of the third pair of differential amplifiers, and a fourth output current of the fourth pair of differential amplifiers to produce an output signal.

23. The article of manufacture of claim 22, wherein the instructions are programmed in a hardware description language selected from the group consisting of HDL, VHDL and RTL.

* * * * *

UNITED STATES PATENT AND TRADEMARK OFFICE
CERTIFICATE OF CORRECTION

| | | |
|---|---|---|
| PATENT NO. | : 7,880,544 B2 | Page 1 of 1 |
| APPLICATION NO. | : 12/369412 | |
| DATED | : February 1, 2011 | |
| INVENTOR(S) | : Szymon Gerka et al. | |

It is certified that error appears in the above-identified patent and that said Letters Patent is hereby corrected as shown below:

Column 10
Line 19, amend "comprises" to --comprise--.
Line 20, amend "comprises" to --comprise--.
Line 22, insert --the-- before "first".

Column 11
Line 12, amend "paid" to --pair--.

Signed and Sealed this
Nineteenth Day of April, 2011

David J. Kappos
*Director of the United States Patent and Trademark Office*